United States Patent
Ikesu et al.

(10) Patent No.: US 12,117,480 B2
(45) Date of Patent: Oct. 15, 2024

(54) SEMICONDUCTOR FAILURE ANALYSIS DEVICE AND SEMICONDUCTOR FAILURE ANALYSIS METHOD

(71) Applicant: HAMAMATSU PHOTONICS K.K., Hamamatsu (JP)

(72) Inventors: Masataka Ikesu, Hamamatsu (JP); Shinsuke Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/798,980

(22) PCT Filed: Nov. 17, 2020

(86) PCT No.: PCT/JP2020/042821
§ 371 (c)(1),
(2) Date: Aug. 11, 2022

(87) PCT Pub. No.: WO2021/166345
PCT Pub. Date: Aug. 26, 2021

(65) Prior Publication Data
US 2023/0072615 A1    Mar. 9, 2023

(30) Foreign Application Priority Data
Feb. 18, 2020   (JP) ................. 2020-025354

(51) Int. Cl.
*G01R 31/265*        (2006.01)
*G01R 31/28*         (2006.01)
(Continued)

(52) U.S. Cl.
CPC ..... *G01R 31/2656* (2013.01); *G01R 31/2891* (2013.01); *G01R 31/2894* (2013.01); *G01R 31/311* (2013.01); *H01L 22/00* (2013.01)

(58) Field of Classification Search
CPC .. G01R 31/265; G01R 31/01; G01R 31/2656; G01R 31/2891; G01R 31/2894;
(Continued)

(56) References Cited

U.S. PATENT DOCUMENTS

2003/0102292 A1   6/2003 Han et al.
2010/0026328 A1   2/2010 Tanaka
(Continued)

FOREIGN PATENT DOCUMENTS

JP    H5-121504 A    5/1993
JP    H09-008103 A   1/1997
(Continued)

OTHER PUBLICATIONS

English Translation of Tanaka JP 2010219110 A Probe Method and Probe Device (Year: 2010).*
(Continued)

*Primary Examiner* — Eman A Alkafawi
*Assistant Examiner* — Courtney G McDonnough
(74) *Attorney, Agent, or Firm* — Faegre Drinker Biddle & Reath LLP

(57) ABSTRACT

A semiconductor failure analysis device includes an analysis part that analyzes a failure place in a semiconductor device; a marking part that irradiates the semiconductor device with laser light; a device arrangement part in which a wafer chuck, which holds the semiconductor device and on which an alignment target is provided, moves relative to the analysis part and the marking part; and a control part that outputs commands. The control part moves the wafer chuck to a position at which the analysis part is capable of taking an image of the alignment target, then outputs an alignment command that causes the marking part to be aligned with the analysis part with the alignment target as a reference, and irradiates the semiconductor device with laser light in a state
(Continued)

in which a positional relationship between the marking part and the analysis part is maintained.

11 Claims, 8 Drawing Sheets

(51) Int. Cl.
*G01R 31/311* (2006.01)
*H01L 21/66* (2006.01)

(58) Field of Classification Search
CPC .... G01R 31/303; G01R 31/311; B23K 26/00; H01L 21/67282; H01L 21/681; H01L 22/00; H01L 22/12; H01L 21/67144; H01L 21/67288; H01L 21/6838; H01L 21/66; H01L 21/68; H01L 21/027; G03F 7/70716; G03F 7/70733; G03F 7/70741; G03F 9/70; G03F 1/00; G03F 7/20; G03F 9/00
USPC .................................................. 324/754.23
See application file for complete search history.

(56) References Cited

U.S. PATENT DOCUMENTS

| | | | |
|---|---|---|---|
| 2018/0033704 A1 | 2/2018 | Suzuki et al. | |
| 2019/0221486 A1 | 7/2019 | Suzuki et al. | |

FOREIGN PATENT DOCUMENTS

| | | | | |
|---|---|---|---|---|
| JP | 2002-168798 A | | 6/2002 | |
| JP | 2002-340990 A | | 11/2002 | |
| JP | 2004-146428 A | | 5/2004 | |
| JP | 2008-261667 A | | 10/2008 | |
| JP | 2010219110 A | * | 9/2010 | ............ H01L 21/66 |
| JP | 2014-092514 A | | 5/2014 | |
| JP | 2016-148550 A | | 8/2016 | |
| KR | 101008319 B1 | | 1/2011 | |
| WO | WO-2016/056110 A1 | | 4/2016 | |

OTHER PUBLICATIONS

International Preliminary Report on Patentability dated Sep. 1, 2022 for PCT/JP2021/000888.
International Preliminary Report on Patentability dated Sep. 1, 2022 for PCT/JP2020/042821.

* cited by examiner

SEMICONDUCTOR FAILURE ANALYSIS DEVICE AND SEMICONDUCTOR FAILURE ANALYSIS METHOD

TECHNICAL FIELD

The present invention relates to a semiconductor failure analysis device and a semiconductor failure analysis method.

BACKGROUND ART

As a technique for analyzing a semiconductor device, when a failure place is identified, there is a technique for marking several places around the failure place by radiating laser light thereto. In a post-process in the failure analysis, the failure place can be easily ascertained based on the mark. Therefore, such a technique is extremely effective.

Patent Literature 1 discloses an analysis device for a semiconductor device. The analysis device disclosed in Patent Literature 1 has a configuration for analyzing for a failure place in a semiconductor device and a configuration for marking a vicinity of the failure place. First, the analysis device aligns a configuration for detecting the failure place with a configuration for marking. Next, the analysis device analyzes for a failure place while moving the configuration for detecting a failure place with respect to the semiconductor device. When the configuration for detecting a failure place identifies a position of a failure place, the analysis device moves the marked configuration to the position of the failure place.

CITATION LIST

Patent Literature

[Patent Literature 1] Japanese Unexamined Patent Publication No. 2016-148550

SUMMARY OF INVENTION

Technical Problem

In the post-process of the failure analysis, the position of the failure place is identified based on the mark. Therefore, it is desirable that the mark accurately indicate the position of the failure place. On the other hand, even when a moving mechanism such as an XY stage that moves components of the device has high accuracy, a slight error occurs between a position indicated by a movement command value and an actual position. Even in a case of a slight error, the position of the failure place indicated by the mark may deviate from a position of an actual failure place. That is, the deviation between the actual position of the failure place and the position of the failure place indicated by the mark depends on the accuracy of the moving mechanism.

An object of the present invention is to provide a semiconductor failure analysis device and a semiconductor failure analysis method capable of reducing deviation between a position of a failure place and a position of a failure place indicated by a mark.

Solution to Problem

A semiconductor failure analysis device according to an aspect of the present invention includes an analysis part in which a first optical detection part receives first light from a semiconductor device via a first optical system, and the first optical system is moved relative to the semiconductor device by a first drive part, a marking part in which a second optical detection part receives second light from the semiconductor device via a second optical system, the semiconductor device is irradiated with laser light via the second optical system, and the second optical system is moved relative to the semiconductor device by a second drive part, a device arrangement part having a chuck disposed between the analysis part and the marking part to hold the semiconductor device and provided with a target that aligns an optical axis of the first optical system with an optical axis of the second optical system, the chuck being moved relative to the analysis part and the marking part by a third drive part, and a control part configured to output a command to the analysis part, the marking part, and the device arrangement part. The target is detectable by the first optical detection part from one side of the target and is detectable by the second optical detection part from the other side of the target. The control part outputs an alignment command that moves the chuck to a position at which the target is detectable by the first optical detection part and then aligns the optical axis of the second optical system with the optical axis of the first optical system with the target as a reference to the marking part and the device arrangement part, and outputs a marking command that irradiates a marking position set on the semiconductor device with the laser light in a state in which a positional relationship between the optical axis of the first optical system and the optical axis of the second optical system is maintained to the marking part and the device arrangement part.

Another aspect of the present invention is a semiconductor failure analysis method which analyzes a semiconductor device using a semiconductor failure analysis device. The semiconductor failure analysis device includes an analysis part in which a first optical detection part receives first light from a semiconductor device via a first optical system, and the first optical system is moved relative to the semiconductor device by a first drive part, a marking part in which a second optical detection part receives second light from the semiconductor device via a second optical system, the semiconductor device is irradiated with laser light via the second optical system, and the second optical system is moved relative to the semiconductor device by a second drive part, a device arrangement part having a chuck disposed between the analysis part and the marking part to hold the semiconductor device and provided with a target that aligns an optical axis of the first optical system with an optical axis of the second optical system, the chuck being moved relative to the analysis part and the marking part by a third drive part, and a control part configured to output a command to the analysis part, the marking part, and the device arrangement part. The target is detectable by the first optical detection part from one side of the target and is detectable by the second optical detection part from the other side of the target. The semiconductor failure analysis method includes an alignment step of moving the chuck to a position at which the target is detectable by the first optical detection part and then aligning the optical axis of the second optical system with the optical axis of the first optical system with the target as a reference, and a marking step of irradiating a marking position set on the semiconductor device with the laser light in a state in which a positional relationship between the optical axis of the first optical system and the optical axis of the second optical system is maintained.

In the semiconductor failure analysis device and the semiconductor failure analysis method, first, the optical axis of the second optical system included in the marking part is aligned with the optical axis of the first optical system included in the analysis part based on the target provided in the chuck. Then, the marking position set in the semiconductor device is irradiated with laser light in a state in which a positional relationship between the optical axis of the first optical system and the optical axis of the second optical system is maintained. That is, after the optical axis of the first optical system and the optical axis of the second optical system are aligned with each other, one of the first optical system and the second optical system does not move relative to the other. Therefore, there is no deviation between a position indicated by a movement command value which may occur due to movement and an actual position. As a result, it is possible to reduce a deviation of a position of the failure place indicated by a mark with respect to a position of the failure place indicated by the analysis part.

In the semiconductor failure analysis device according to one aspect, the control part may output an analysis command that analyzes a failure place in the semiconductor device with the analysis part to the analysis part before the alignment command is output. Similarly, the semiconductor failure analysis method according to another aspect may further include an analysis step of analyzing a failure place in the semiconductor device with the analysis part before the alignment step. With such a configuration, it is possible to put a mark indicating the position of a failure place with high accuracy.

In the semiconductor failure analysis device according to one aspect, the marking command may cause the chuck to be moved to the marking position by the third drive part and then may cause the semiconductor device to be irradiated with the laser light. Similarly, in the semiconductor failure analysis method according to another aspect, the marking step may cause the chuck to be moved to the marking position by the third drive part and then may cause the semiconductor device to be irradiated with the laser light. With such a configuration, after the optical axis of the second optical system is aligned with the optical axis of the first optical system, it is possible to irradiate a desired position on the semiconductor device with the laser light in a state in which an absolute position in addition to the relative position of the first optical system and the second optical system is maintained. As a result, it is possible to further reduce the deviation of the position of the failure place indicated by the mark put by the marking part.

In the semiconductor failure analysis device according to one aspect, the alignment command may cause the first optical detection part to acquire a first image of the target from one side, may cause the second optical detection part to acquire a second image of the target from the other side, and may move the second drive system so that the optical axis of the second optical system is aligned with the optical axis of the first optical system based on the first image and the second image. Similarly, in the semiconductor failure analysis method according to another aspect, the alignment step may cause the first optical detection part to acquire a first image of the target from one side, may cause the second optical detection part to acquire a second image of the target from the other side, and may move the second optical system so that the optical axis of the second optical system is aligned with the optical axis of the first optical system based on the first image and the second image. With such a configuration, an operation in which the optical axis of the second optical system is aligned with the optical axis of the first optical system can be reliably performed.

In the semiconductor failure analysis device according to one aspect, the target may be provided at a position different from a device holding part of the chuck in which the semiconductor device is held. With such a configuration, the optical axis of the second optical system can be aligned with the optical axis of the first optical system regardless of a type of the semiconductor device.

In the semiconductor failure analysis device according to one aspect, the first optical detection part may acquire a first image of the target seen from one side, and the second optical detection part may acquire a second image of the target seen from the other side. With such a configuration, the operation in which the optical axis of the second optical system is aligned with the optical axis of the first optical system can be reliably performed.

In the semiconductor failure analysis device according to one aspect, the target may include a light transmission part which transmits light that is detectable by the first optical detection part and the second optical detection part. With such a configuration, the operation in which the optical axis of the second optical system is aligned with the optical axis of the first optical system can be reliably performed.

Advantageous Effects of Invention

According to the present invention, there is provided a semiconductor failure analysis device and a semiconductor failure analysis method capable of reducing a deviation between a position of a failure place and a position indicated by a mark.

BRIEF DESCRIPTION OF DRAWINGS

FIG. 2(a) is a diagram showing a back surface of a laser-marked semiconductor device. FIG. 2(b) is a diagram showing a front surface of the laser-marked semiconductor device. FIG. 2(c) is a cross-sectional view along line II(c)-II(c) of FIG. 2(b).

DESCRIPTION OF EMBODIMENTS

Figure 1:
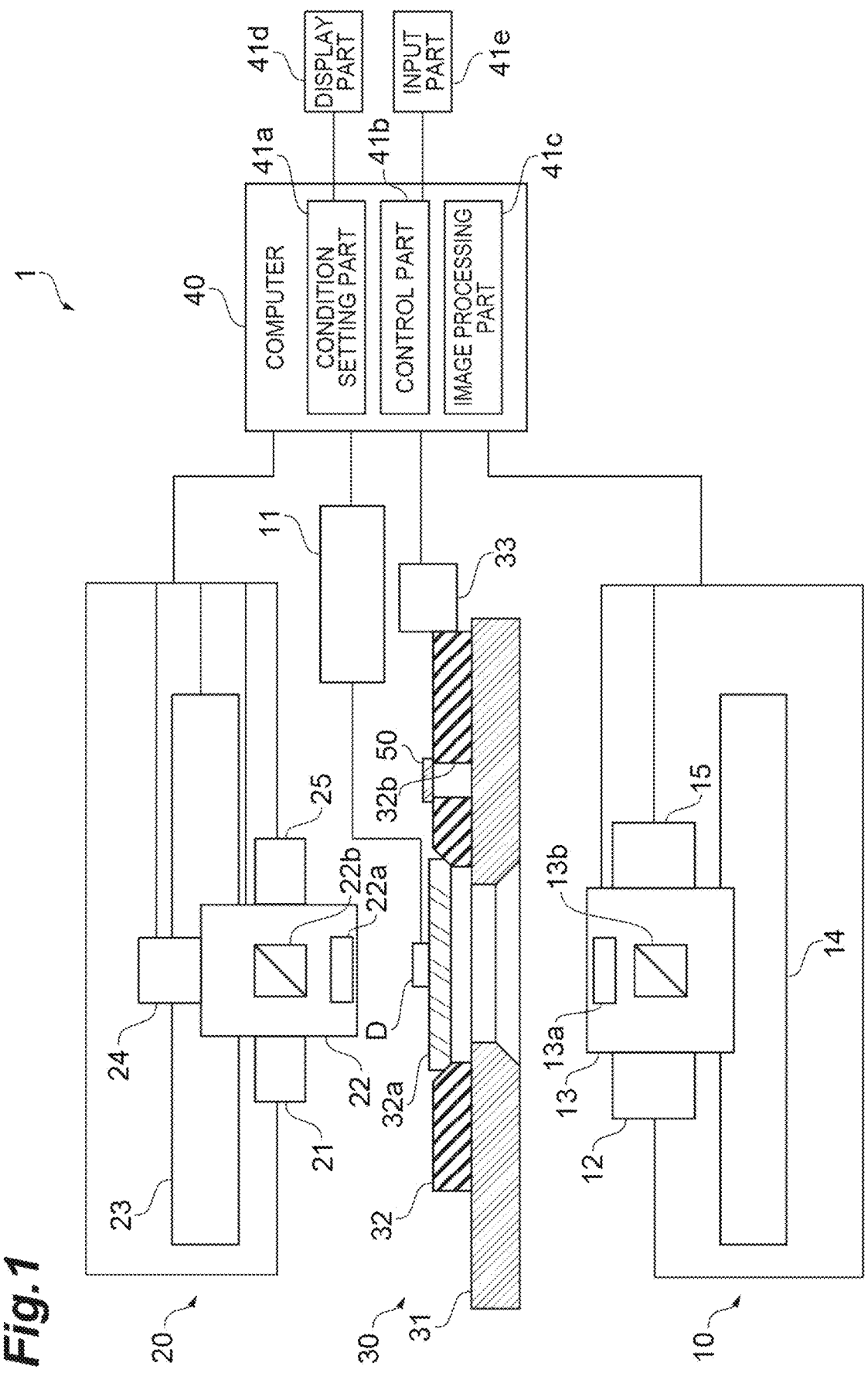
FIG. 1 is a configuration diagram of a semiconductor failure analysis device according to an embodiment.

Hereinafter, embodiments for implementing the present invention will be described in detail with reference to the accompanying drawings. In the description of the drawings, the same elements are designated by the same reference numerals, and duplicate description thereof will be omitted.

As shown in FIG. 1, a semiconductor failure analysis device according to the present embodiment analyzes a semiconductor device D which is a device under test (DUT). In the following description, the semiconductor failure analysis device according to the present embodiment is simply referred to as "analysis device 1". Further, the analysis of the semiconductor device D includes, for example, identification of a position of a failure place included in the semiconductor device D. The analysis of the semiconductor device D is not limited to identifying the position of the failure place. The analysis of the semiconductor device D includes other analyzes, inspections and the like relating to the semiconductor device D. Hereinafter, the analysis device 1 of the present embodiment will be described as one that identifies the position of the failure place included in the semiconductor device D.

Further, the analysis device 1 identifies the position of the failure place and puts a seal (a mark) indicating the failure place around the failure place. An operation of putting the mark is referred to as "marking". The mark is for easily grasping the failure place identified by the analysis device 1 in a post-process of the failure analysis.

Examples of the semiconductor device D include a logic device that is an integrated circuit (IC) having a PN junction such as a transistor or a large-scale integration (LSI), a memory device, an analog device, a mixed signal device that is a combination thereof, a power semiconductor device (a power device) such as a high-current/high-voltage MOS transistor, a bipolar transistor, and an IGBT, and the like. The semiconductor device D has a laminated structure including a substrate and a metal layer. As the substrate of the semiconductor device D, for example, a silicon substrate is used.

The analysis device 1 includes an analysis part 10, a marking part 20, a device arrangement part 30, and a computer 40. The analysis part 10 identifies the failure place of the semiconductor device D. The marking part 20 put a mark indicating the position of the failure place. The semiconductor device D is disposed in the device arrangement part 30. The analysis device 1 may be, for example, an inverted emission microscope having a laser marking function.

<Analysis Part>

The analysis part 10 includes a tester unit 11, a light source 12 (a first light source), an observation optical system 13 (a first optical system), an XYZ stage 14 (a first drive part), and a two-dimensional camera 15 (a first optical detection part).

The tester unit 11 is electrically connected to the semiconductor device D via a cable. The tester unit 11 is a stimulus signal application part that applies a stimulus signal to the semiconductor device D. The tester unit 11 is operated by a power source (not shown). The tester unit 11 repeatedly applies a stimulus signal such as a predetermined test pattern to the semiconductor device D. The stimulus signal output by the tester unit 11 may be a modulated current signal or a continuous wave (CW) current signal.

The tester unit 11 is electrically connected to the computer 40 via a cable. The tester unit 11 applies a stimulus signal designated by the computer 40 to the semiconductor device D. The tester unit 11 does not necessarily have to be electrically connected to the computer 40. When the tester unit 11 is not electrically connected to the computer 40, the tester unit 11 determines a stimulus signal such as a test pattern by itself. A power supply, a pulse generator, or the like may be used as the tester unit 11.

The light source 12 outputs light to the semiconductor device D. The light source 12 may be, for example, a light emitting diode (LED) or a super luminescent diode (SLD). Further, the light source 12 may be an incoherent light source such as a lamp light source or a coherent light source such as a laser light source. The light output from the light source 12 passes through the substrate of the semiconductor device D. For example, when the substrate of the semiconductor device D is made of silicon, a wavelength of the light output from the light source 12 is preferably 1064 nm or more. The light output from the light source 12 is provided to the observation optical system 13.

The observation optical system 13 outputs the light output from the light source 12 to the semiconductor device D. For example, the light source 12 irradiates a back surface D1 side of the semiconductor device D with light during a marking process. The observation optical system 13 includes an objective lens 13a and a beam splitter 13b. The objective lens 13a collects light in an observation area.

The observation optical system 13 guides light reflected by the semiconductor device D to the two-dimensional camera 15. Specifically, the light emitted from the observation optical system 13 passes through a substrate SiE of the semiconductor device D (refer to FIG. 2(c)). Next, the light transmitted through the substrate SiE is reflected by a metal layer ME (refer to FIG. 2(c)). Next, the light reflected from the metal layer ME passes through the substrate SiE again. Then, the light transmitted through the substrate SiE is input to the two-dimensional camera 15 via the objective lens 13a and the beam splitter 13b of the observation optical system 13. Further, the observation optical system 13 guides emission light generated from the semiconductor device D by the application of the stimulus signal to the two-dimensional camera 15. Specifically, the metal layer ME of the semiconductor device D may emit light such as emission light due to the application of a stimulus signal. The light emitted by the metal layer ME is transmitted through the substrate SiE and then input to the two-dimensional camera 15 via the objective lens 13a and the beam splitter 13b of the observation optical system 13.

The observation optical system 13 is mounted on the XYZ stage 14. A Z-axis direction is an optical axis direction of the objective lens 13a. The XYZ stage 14 is movable in the Z-axis direction. Further, the XYZ stage 14 can move in an X-axis direction and a Y-axis direction orthogonal to the Z-axis direction. The XYZ stage 14 is controlled by a control part 41b of the computer 40 which will be described below. An observation area is determined by a position of the XYZ stage 14. The observation optical system 13 guides reflected light from the semiconductor device D according to the irradiated light to the two-dimensional camera 15 as light from the semiconductor device D.

The two-dimensional camera 15 receives the light (first light) from the semiconductor device D. The two-dimensional camera 15 outputs image data based on the received light. The light from the semiconductor device D referred to in the specification may be reflected light reflected by the semiconductor device D according to the illumination light. Further, the light from the semiconductor device D referred to in the specification may be emission light generated in response to a stimulus signal. For example, the two-dimensional camera 15 takes an image of the semiconductor device D from the substrate SiE side of the semiconductor device D during the marking process. In other words, the two-dimensional camera 15 takes an image of the semiconductor device D from the back surface D1 side of the semiconductor device D during the marking process.

The two-dimensional camera 15 receives the light reflected by the semiconductor device D. Then, the two-dimensional camera 15 outputs image data for creating a pattern image to the computer 40 based on the received light. A marking position can be grasped by the pattern image. Further, the two-dimensional camera 15 receives the emission light generated in response to the stimulus signal. The two-dimensional camera 15 outputs image data for generating a light emission image to the computer 40 based on the received light. According to the light emission image, a light emission place in the semiconductor device D can be identified. A failure place of the semiconductor device D can be identified by identifying the light emission place.

An image pickup device capable of detecting light having a wavelength transmitted through the substrate SiE of the semiconductor device D may be used as the two-dimensional camera 15. A camera equipped with a charge coupled device (CCD) image sensor or a complementary metal oxide semiconductor (CMOS) image sensor may be adopted as the two-dimensional camera 15. An InGaAs camera, an MCT camera, or the like may be adopted as the two-dimensional camera 15. Illumination light from the light source 12 is unnecessary when the light emission is measured. That is, it is not necessary to operate the light source 12 when the light emission is measured.

<Marking Part>

Next, the marking part 20 will be described. The marking part 20 puts a mark indicating a failure place. The marking part 20 includes a laser light source 21, a laser marking optical system 22 (a second optical system), an XYZ stage 23 (a second drive part), a probing camera 24 (a second optical detection part), and an illumination light source 25.

Figure 2:
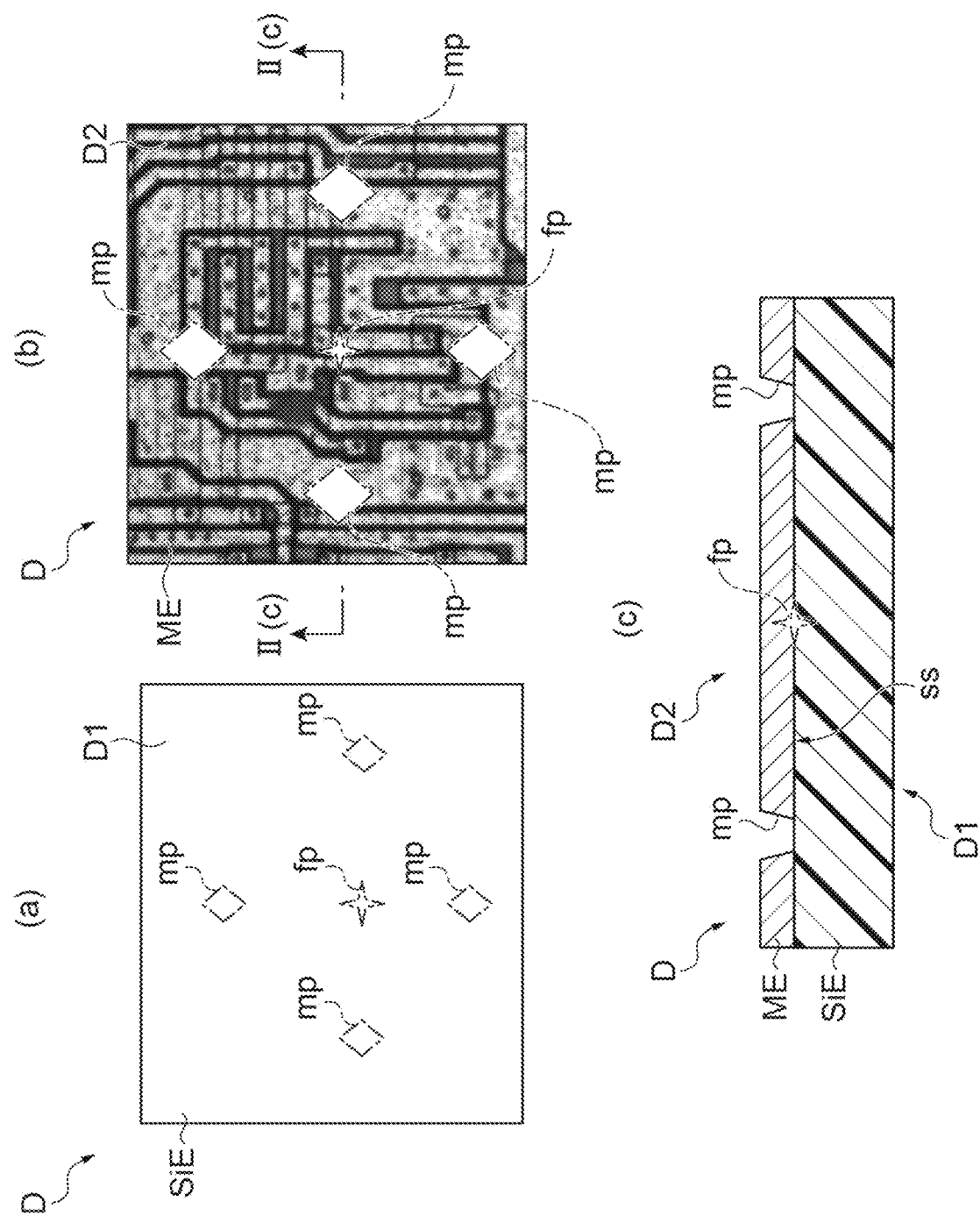
FIG. 2 is a diagram for describing a laser marking image on a semiconductor device.

The marking part 20 puts a mark around the failure place identified by the analysis part 10. As shown in FIGS. 2(a) and 2(b), marking places mp are set around a failure place fp. In FIGS. 2(a) and 2(b), four marking places mp are shown. In a state in which the laser marking is completed, as shown in FIG. 2(c), a through hole that passes through the metal layer ME of the semiconductor device D is formed. The laser marking is performed to an extent that the through hole reaches a boundary surface ss between the metal layer ME and the substrate SiE and thus a surface of the substrate SiE in contact with the metal layer ME is exposed. That is, the "mark" referred to in the specification may be a through hole formed in the metal layer ME. Further, the "mark" referred to in the present specification may be the substrate SiE exposed from the through hole.

Figure 3:
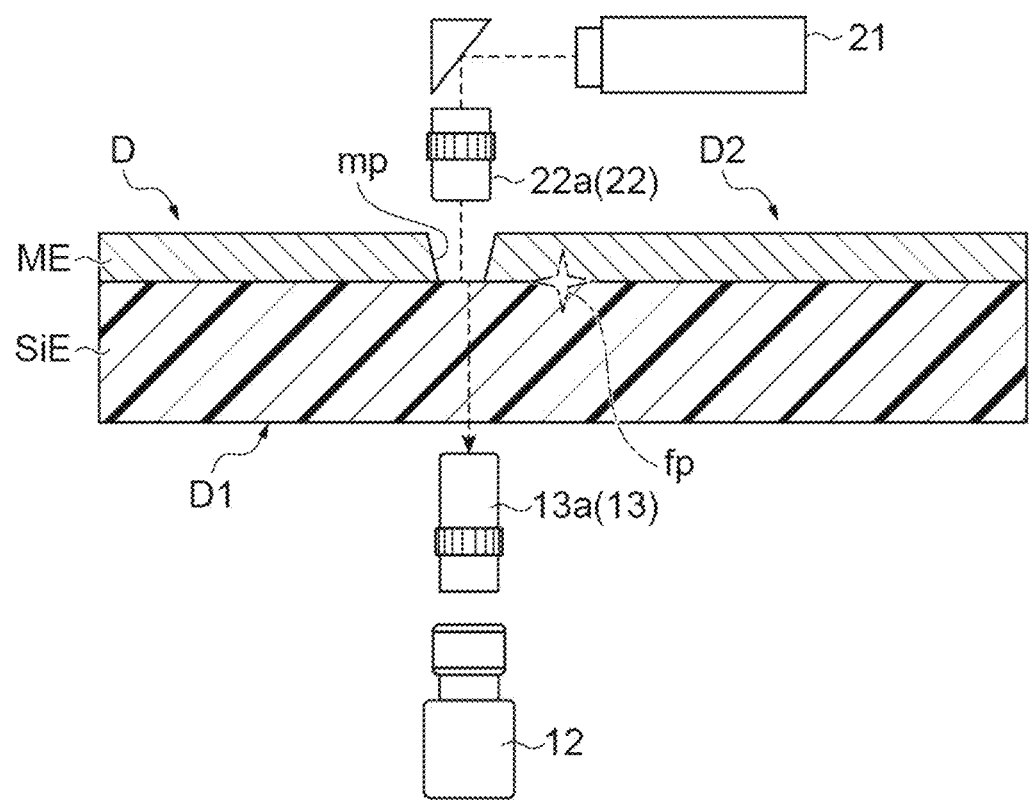
FIG. 3 is a diagram for describing marking control in the analysis device of FIG. 1.

As shown in FIG. 3, the marking part 20 irradiates the marking place mp on the semiconductor device D with the laser light output by the laser light source 21 via the laser marking optical system 22. The marking part 20 irradiates the marking place mp with the laser light from the metal layer ME side of the semiconductor device D. Hereinafter, the details of the marking part 20 will be described.

As shown in FIG. 1, the laser light source 21 outputs the laser light radiated to the semiconductor device D. The laser light forms a through hole in the metal layer ME. The laser light source 21 starts an output of the laser light when an output start command is input from the computer 40. For example, a solid-state laser light source, a semiconductor laser light source, or the like may be adopted as the laser light source 21. A wavelength of the light output from the laser light source 21 is 250 nm or more and 2000 nm or less.

The laser marking optical system 22 irradiates the marking place mp on the semiconductor device D with the laser light. Specifically, the laser marking optical system 22 irradiates the semiconductor device D with the laser light from the metal layer ME side of the semiconductor device D. In other words, the laser marking optical system 22 irradiates the semiconductor device D with the laser light from the front surface D2 side of the semiconductor device D. The laser marking optical system 22 has an objective lens 22a and a switching part 22b. The switching part 22b switches an optical path of the laser light source 21 and the probing camera 24. The objective lens 22a concentrates the laser light on the marking place mp. The objective lens 22a guides the light coining from the surface of the semiconductor device D to the probing camera 24.

The laser marking optical system 22 is mounted on the XYZ stage 23. The Z-axis direction of the XYZ stage 23 is an optical axis direction of the objective lens 22a. The XYZ stage 23 receives a control command from the computer 40. The XYZ stage 23 moves the laser marking optical system 22 in the Z-axis direction according to a control command. Further, the XYZ stage 23 moves the laser marking optical system 22 in the X-axis direction and the Y-axis direction orthogonal to the Z-axis direction according to a control command. Further, the laser marking optical system 22 may have an optical scanning part that replaces the XYZ stage 23 and may concentrate the laser light on the marking place mp on the front surface D2 of the semiconductor device D. An optical scanning element such as a galvano mirror or a MEMS mirror may be used as the optical scanning part. Further, the laser marking optical system 22 may include a shutter. With such a configuration, the laser light from the laser light source 21 under the control of the control part 41b is passed or blocked by the shutter. As a result, the output of the laser light can be controlled.

The probing camera 24 takes an image of the metal layer ME of the semiconductor device D from the front surface D2 side of the semiconductor device D. The probing camera 24 outputs the captured image to the computer 40. A user can grasp a state of laser marking as seen from the front surface D2 side of the semiconductor device D by checking the captured image. The illumination light source 25 illuminates the semiconductor device D with illumination light when the probing camera 24 takes an image.

<Device Arrangement Part>

The device arrangement part 30 holds the semiconductor device D. Further, the device arrangement part 30 changes a position of the semiconductor device D with respect to the observation optical system 13. Similarly, the device arrangement part 30 changes the position of the semiconductor device D with respect to the laser marking optical system 22. The device arrangement part 30 includes a sample stage 31, a wafer chuck 32, and an XY drive part 33 (a third drive part).

Therefore, the analysis device 1 includes a drive mechanism for each of the observation optical system 13, the laser marking optical system 22, and the device arrangement part 30. That is, the analysis device 1 has three degrees of freedom. According to the configuration having three degrees of freedom, for example, the laser marking optical system 22 and the device arrangement part 30 can be moved in a state in which the observation optical system 13 is fixed. Further, the device arrangement part 30 can be moved in a state in which the observation optical system 13 and the laser marking optical system 22 are fixed. The term "fixed" means that the position is not changed. For example, the "state in which the observation optical system 13 and the laser marking optical system 22 are fixed" means a state in which a relative position of the laser marking optical system 22 with respect to the observation optical system 13 is maintained.

A wafer chuck 32 is slidably mounted on the sample stage 31. The wafer chuck 32 has a device holding part 32a for holding the semiconductor device D. The device holding part 32a includes a through hole provided in the wafer chuck 32 and a glass plate that physically closes the through hole.

Figure 4:
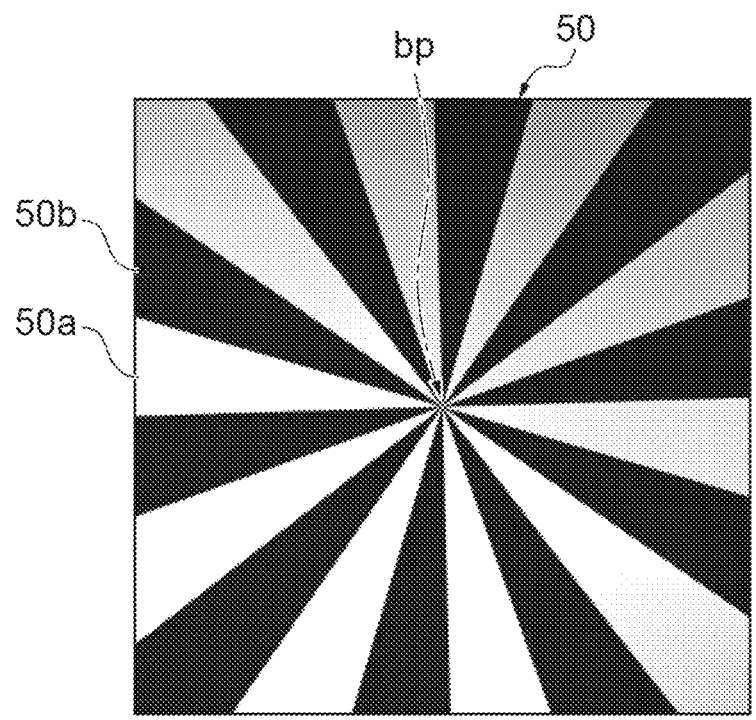
FIG. 4 is a view showing a target in a plan view.

The wafer chuck 32 has an alignment target 50. The alignment target 50 (refer to FIG. 4) is a glass plate. A pattern that extends radially around a reference point bp is provided on one surface of the glass plate. This pattern is configured of, for example, a metal film. As an example, the pattern is created by a thin film of aluminum. Therefore, the pattern constitutes an opaque part 50b. The glass plate transmits the light having a wavelength that passes through the substrate SiE of the semiconductor device D. As a result, the glass plate also transmits the light output from the illumination light source 25 and the light source 12. Therefore, a region in which the pattern is not provided constitutes a light transmission part 50a. The wafer chuck 32 has a target hole 32b in which the alignment target 50 is disposed. The alignment target 50 is disposed to close the target hole 32b. According to such an arrangement, the probing camera 24 and the two-dimensional camera 15 can acquire an image of the pattern provided on one surface of the glass plate.

The alignment target 50 is provided on the wafer chuck 32. That is, in the wafer chuck 32, a position at which the device holding part 32a is provided is different from a position in which the alignment target 50 is provided. When the position of the wafer chuck 32 is changed by the XY drive part 33, the position of the semiconductor device D and the position of the alignment target 50 are changed at the same time. That is, the position of the alignment target 50 with respect to the semiconductor device D attached to the wafer chuck 32 is unchanged.

The XY drive part 33 moves the wafer chuck 32 in the X-axis direction or the Y-axis direction according to a control command from the computer 40. As a result, the observation area can be changed without moving the observation optical system 13. Similarly, the irradiation position of the laser light can be changed without moving the laser marking optical system 22.

The specific configuration of the device arrangement part 30 is not limited to the above configuration. The device arrangement part 30 may adopt a configuration that has a function of holding the semiconductor device D and a function of moving the semiconductor device D in at least one of the X-axis direction and the Y-axis direction. For example, instead of the sample stage 31 and the XY drive part 33, there may be provided an XY stage that moves the wafer chuck 32 in at least one of the X-axis direction and the Y-axis direction.

<Computer>

The computer 40 is a computer such as a personal computer. The computer 40 is physically configured to include a memory such as a RAM and a ROM, a processor (an arithmetic circuit) such as a CPU, a communication interface, and a storage part such as a hard disk. Examples of the computer 40 include a personal computer, a cloud server, a smart device (a smart phone, a tablet terminal, and the like) and the like. The computer 40 functions by executing a program stored in the memory on the CPU of a computer system. The computer 40 includes a condition setting part 41a, a control part 41b, and an image processing part 41c as functional components.

<Condition Setting Part>

The condition setting part 41a sets the marking place mp based on information indicating the failure place fp input from an input part 41e. Several marking places mp are set around the identified failure place fp. The several places are, for example, four places. For example, when the information indicating a failure place fp is input, the condition setting part 41a automatically sets the marking places mp centering on the failure place fp at four positions around the failure place fp. Specifically, the condition setting part 41a sets the marking places mp in a cross shape centering on the failure place fp, for example, in a plan view (refer to FIGS. 2(a) and 2(b)). The marking places mp may be set by the input part 41e accepting an input of the information indicating the marking place mp from the user who has seen an analysis image displayed on a display part 41d. In this case, the condition setting part 41a does not automatically set the marking place mp. The condition setting part 41a sets the marking place mp based on the information indicating the marking place mp input from the input part 41e. The condition setting part 41a generates a reference image. The reference image is obtained by adding a mark indicating the failure place fp and a mark indicating the marking place mp to the analysis image. The condition setting part 41a saves the reference image in the memory of the computer 40.

<Control Part>

The control part 41b controls the XYZ stage 14 of the analysis part 10 so that the observation area of the failure place enters the field of view of the two-dimensional camera 15. The control part 41b controls the XYZ stage 23 of the marking part 20 so that the optical axis of the laser marking optical system 22 coincides with the optical axis of the observation optical system 13. The control part 41b controls the XY drive part 33 of the device arrangement part 30 so that the optical axis of the laser marking optical system 22 overlaps the marking place mp.

The control part 41b also controls the laser light source 21. When the image processing part 41c determines that a mark image has appeared, the control part 41b outputs an output stop signal to the laser light source 21. The laser light source 21 stops an output of the laser light when the output stop signal is input. Therefore, the laser light source 21 continues to output the laser light from the input of the output start signal to the input of the output stop signal by the control part 41b. From the above, the control part 41b controls the laser light source 21 so that the laser marking is performed until the mark image formed by the laser marking appears in the pattern image. Further, since a penetration threshold value of the laser light is set, the control part 41b controls the laser light source 21 so that the laser marking is performed until the laser light penetrates the metal layer ME.

<Image Processing Part>

The computer 40 is electrically connected to the two-dimensional camera 15 via a cable. The computer 40 creates a pattern image and a light emission image using the image data input from the two-dimensional camera 15. Here, it is difficult to identify a light emitting position in the pattern of the semiconductor device D only with the above-described light emission image. Therefore, the computer 40 generates, as an analysis image, an overlapping image in which a pattern image based on the reflected light from the semiconductor device D and a light emission image based on the light emitted from the semiconductor device D overlap each other.

The image processing part 41c creates a marking image. In the marking image, a pattern image including the mark image and a light emission image overlap each other. The created marking image is stored in the memory of the computer 40. Further, the image processing part 41c displays the marking image on the display part 41d. The marking image allows the user to accurately grasp the marking position with respect to the position of the failure place in the subsequent process. Further, the image processing part 41c acquires marking information. The marking information is information necessary for grasping the marking position with respect to the position of the failure place. Examples of the marking information include a distance from the marking position to the position of the failure place, an orientation of the marking position based on the position of the failure place, and the like. The acquired marking information may be displayed as a list. Further, the marking information may be added to and displayed in the marking image. Further, the marking information may be output on a paper medium.

The computer 40 outputs the analysis image to the display part 41d. The display part 41d is a display device such as a display for showing the analysis image or the like to the user. The user can confirm the position of the failure place from the analysis image displayed on the display part 41d. Further, the user inputs the information indicating the failure place using the input part 41e. The input part 41e is an input device such as a keyboard and a mouse that receives an input from the user. The input part 41e outputs the information indicating the failure place to the computer 40. The computer 40, the display part 41d, and the input part 41e may be tablet terminals.

The image processing part 41c may output a control command for stopping the irradiation of the laser light to the control part 41b. The control command for stopping the irradiation of the laser light is generated using the mark image appearing in the pattern image. Specifically, the image processing part 41c sequentially generates the pattern image in parallel with the laser marking by the laser light output from the laser light source 21. Due to the laser marking, a hole is formed in the metal layer ME corresponding to the marking place mp. When the hole of the metal layer ME is shallow, a change in the intensity of the reflected light at the marking position is small, and a change in an optical reflection image is also small. In other words, when the hole formed by the laser marking is formed only in the metal layer ME and does not reach the substrate SiE, the change in the intensity of the reflected light at the marking position is small. Therefore, the change in the optical reflection image is also small. As a result, an effect of the laser marking does not appear in the pattern image. On the other hand, when the hole of the metal layer ME becomes deeper, a change in at least one of a refractive index, a transmittance, and a reflectance of the light on the back surface D1 side becomes large. Specifically, when the hole becomes deep enough to reach a boundary surface ss between the metal layer ME and the substrate SiE, the change in at least one of the refractive index, the transmittance, and the reflectance of the light on the back surface D1 side becomes large. Due to such a change, the change in the intensity of the reflected light at the marking position becomes large. As a result, the mark image indicating the marking place appears in the pattern image.

The image processing part 41c compares, for example, the above-described reference image with the pattern image. As a result of the comparison, when a difference between the images is larger than a predetermined value, the image processing part 41c determines that the mark image has appeared. It is possible to determine a timing at which it is determined that the mark image has appeared by setting the predetermined value in advance.

The image processing part 41c may determine whether or not the mark image has appeared according to an input content from the user. Further, the image processing part 41c compares the reference image with the pattern image when it is determined that the mark image has appeared. Then, when a mark forming place in the pattern image deviates from the marking place mp in the reference image, the image processing part 41c may determine that a mark position deviation has occurred. In this case, the laser marking may be performed again so that the mark is formed at a correct marking place mp.

Figure 5:
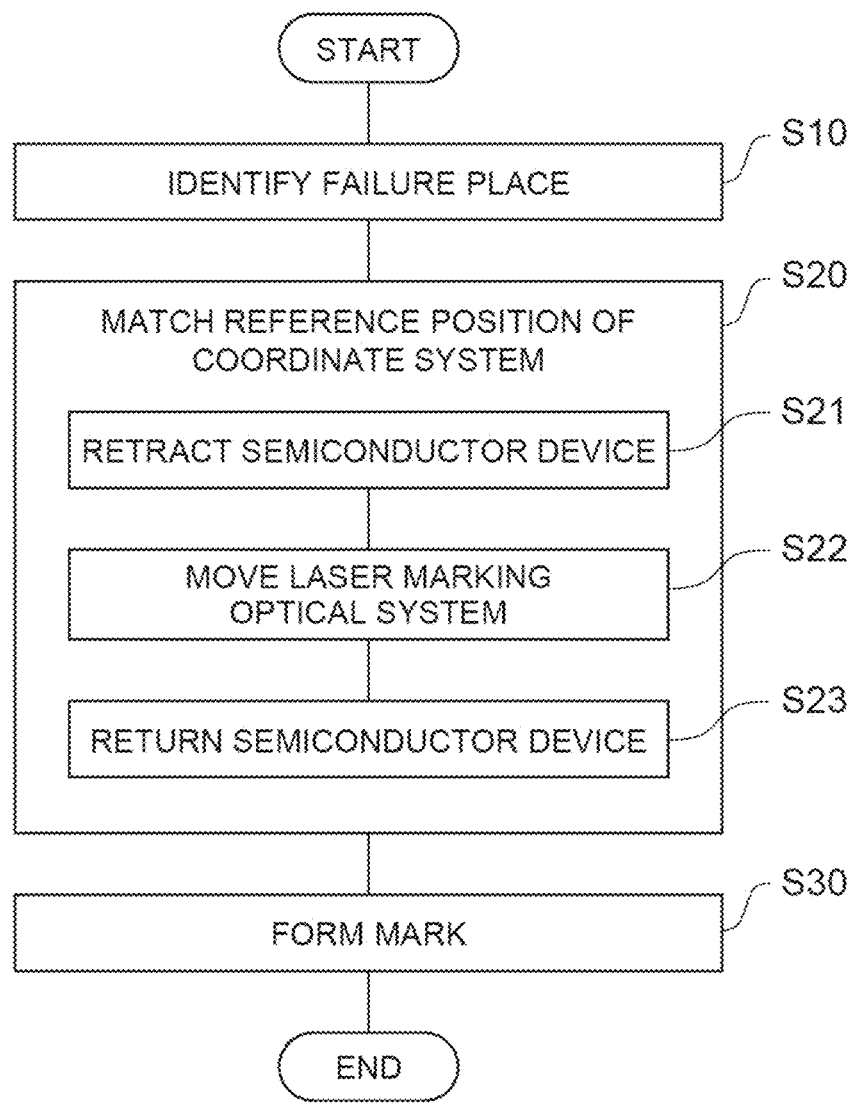
FIG. 5 is a flowchart showing main steps of a semiconductor failure analysis method using the analysis device of FIG. 1.
Figure 6:
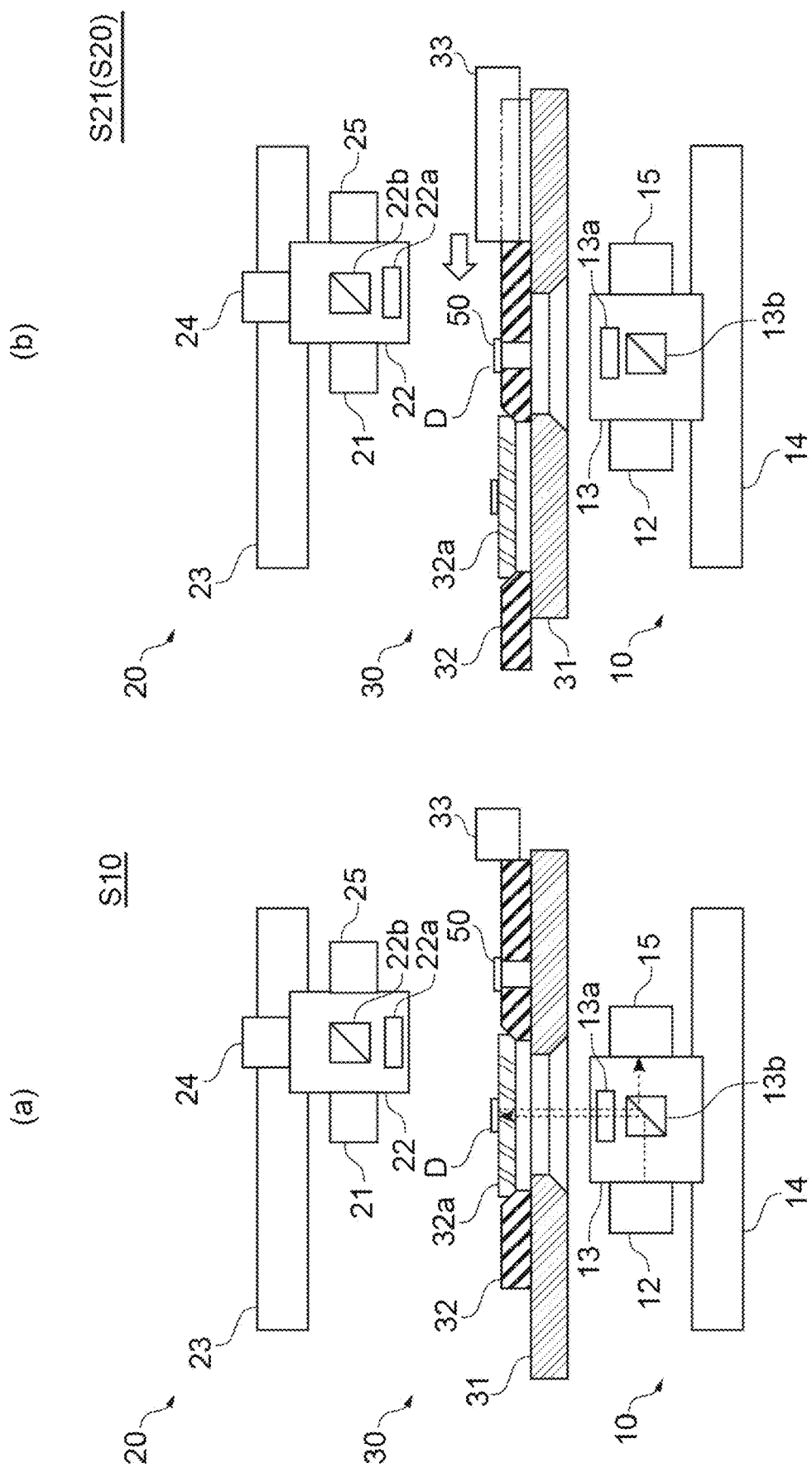
FIG. 6(a) is a diagram showing an analysis step.
FIG. 6(b) is a diagram showing one step constituting an alignment step.
Figure 7:
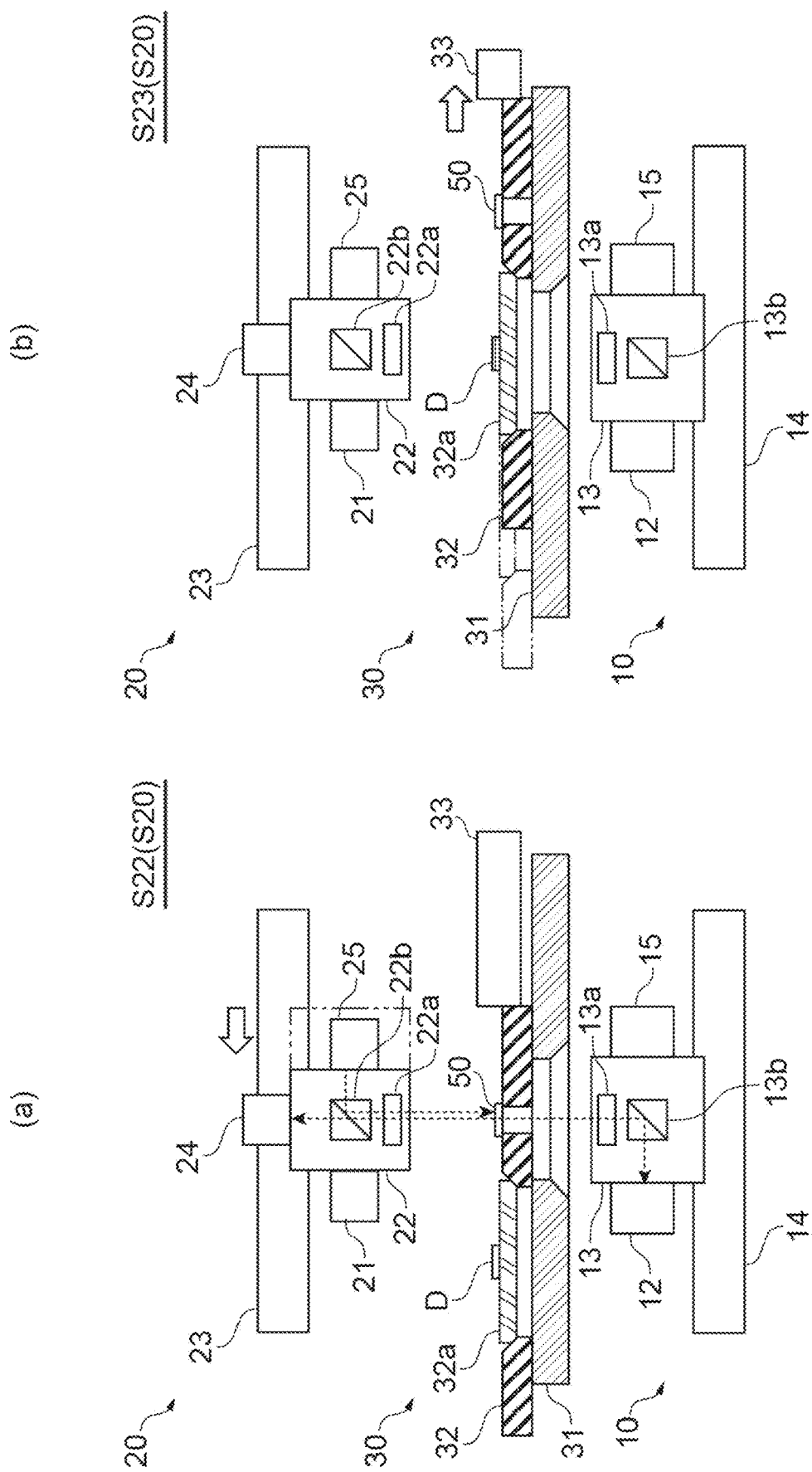
FIG. 7(a) is a diagram showing one step constituting the alignment step following FIG. 6(b).
FIG. 7(b) is a diagram showing one step constituting the alignment step following FIG. 7(a).

Next, marking processing of the analysis device 1 will be described with reference to FIGS. 5 to 8. FIG. 5 is a flow chart showing a main process in the marking step of the analysis device 1.

<Analysis Step S10>

First, the failure place of the semiconductor device D is identified (S10). The control part 41b outputs an analysis command for step S10 to the analysis part 10. Specifically, as shown in FIG. 6(a), the XYZ stage 14 controls the X-axis direction and the Y-axis direction to move the observation optical system 13 to capture an area to be observed in the field of view of the observation optical system 13. Next, the observation optical system 13 is moved by controlling the Z-axis direction of the XYZ stage 14 so that a focal position of the objective lens 13a is aligned with the area to be observed. Next, the light source 12 irradiates the semiconductor device D with light. Then, the two-dimensional camera 15 receives the reflected light from the semiconductor device D. The two-dimensional camera 15 generates an optical reflection image based on the reflected light. Then, the two-dimensional camera 15 outputs the optical reflection image to the computer 40. After the optical reflection image is output, the light source 12 stops irradiating the semiconductor device D with light. Subsequently, the tester unit 11 applies a stimulus signal to the semiconductor device D. Then, the two-dimensional camera 15 receives the light caused by the stimulus signal. The two-dimensional camera 15 generates a light emission image based on the light caused by the stimulus signal. Then, the two-dimensional camera 15 outputs the light emission image to the computer 40. The image processing part 41c generates an analysis image in which the optical reflection image and the light emission image overlap each other. Next, the failure place fp is identified using the analysis image.

As described above, in a period during which the analysis step is being performed, a positional relationship of the observation optical system 13 with respect to the semiconductor device D includes an observation area in the field of view of the observation optical system 13. Then, the positional relationship of the observation optical system 13 with respect to the semiconductor device D is maintained during the period during which the analysis step is being performed. On the other hand, the position of the laser marking optical system 22 with respect to the semiconductor device D is not particularly limited during the period during which the analysis step is being performed. For example, the optical axis of the laser marking optical system 22 may or may not coincide with the optical axis of the observation optical system 13. Normally, the optical axis of the laser marking optical system 22 does not coincide with the optical axis of the observation optical system 13 unless alignment of the optical axis is performed. In the analysis method of the present embodiment, the alignment of the optical axis is performed before the above-described analysis step, but it is not essential. In the analysis method of the present embodiment, the alignment of the optical axis is performed after the analysis step is completed.

<Alignment Step S20>

Next, the alignment between the observation optical system 13 and the laser marking optical system 22 is performed (S20). The control part 41b outputs an alignment command for step S20 to the marking part 20 and the device arrangement part 30. In the following description, a state in which the optical axis of the observation optical system 13 intersects the failure place of the semiconductor device D immediately before the alignment step is performed is exemplified. First, as shown in FIG. 6(b), the XY drive part 33 controls the X-axis direction and the Y-axis direction to move the wafer chuck 32 so that the alignment target 50 is captured in the field of view of the observation optical system 13 (S21). This movement is also referred to as "retraction of the semiconductor device D". At this time, the control part 41b stores a movement amount of the semiconductor device D (the wafer chuck 32).

Next, as shown in FIG. 7(a), the XYZ stage 23 controls the X-axis direction and the Y-axis direction to move the laser marking optical system 22 so that the alignment target 50 is captured in the field of view of the laser marking optical system 22 (S22). Next, the illumination light source 25 outputs the illumination light toward the alignment target 50. The illumination light passes through the light transmission part 50a of the alignment target 50 and is incident on the observation optical system 13. The incident illumination light is captured by the probing camera 24. The probing camera 24 outputs a transmission image to the computer 40. Further, the illumination light is reflected by the opaque part 50b of the alignment target 50. The reflected light is incident on the laser marking optical system 22 again. Then, the incident reflected light is captured by the probing camera 24.

The probing camera 24 outputs a reflection image to the computer 40. The image processing part 41c calculates a deviation of the optical axis of the laser marking optical system 22 with respect to the optical axis of the observation optical system 13 using the transmission image and the reflection image. The movement of the laser marking optical system 22 and the confirmation of the deviation amount are repeated until the deviation is within an allowable range. When it is determined that the deviation is within the allowable range, the alignment of the optical axis is completed.

After the alignment of the optical axis is completed, as shown in FIG. 7(b), the XY drive part 33 controls the X-axis direction and the Y-axis direction to move the wafer chuck 32 so that the failure position of the semiconductor device D is captured in the field of view of the observation optical system 13 (S23). At this time, the control part 41b may control the XY drive part 33 based on the movement amount stored when the semiconductor device D is retracted. Further, the relative positions of the laser marking optical system 22 and the semiconductor device D may be controlled using the image data output from the two-dimensional camera 15 and the probing camera 24. Also in this case, a target to be moved is only the semiconductor device D. The movement of the semiconductor device D in this step is also referred to as "return of the semiconductor device D". That is, since the semiconductor device D is retracted immediately after the alignment of the optical axis is completed, the semiconductor device D is not present in the field of view of the observation optical system 13 and the laser marking optical system 22. Therefore, after the alignment of the optical axis is completed, the semiconductor device D is placed in the field of view of the observation optical system 13 and the laser marking optical system 22. More specifically, the failure place of the semiconductor device D coincides with the optical axis of the observation optical system 13 and the optical axis of the laser marking optical system 22. That is, it is the semiconductor device D that is moved after the alignment is completed. In other words, the observation optical system 13 and the laser marking optical system 22 are not moved after the alignment is completed. As a result, the relative positional relationship between the observation optical system 13 and the laser marking optical system 22 is maintained as a result of the alignment.

<Marking Step S30>

Figure 8:
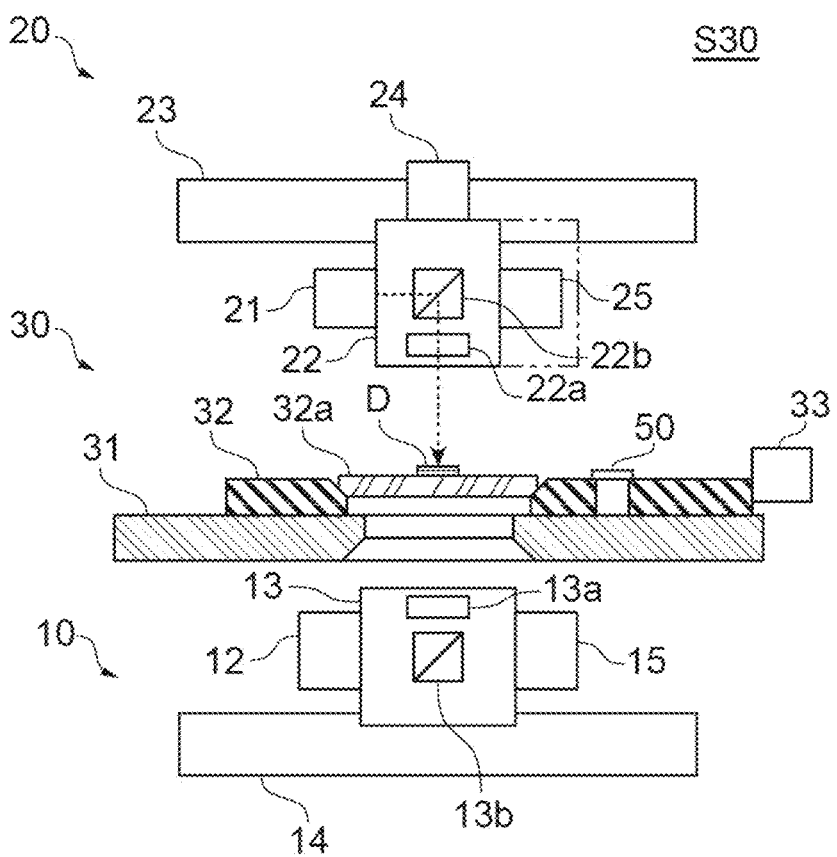
FIG. 8 is a diagram showing one step constituting the alignment step following FIG. 7(b).

As shown in FIG. 8, the laser marking is performed on the marking place mp (S30). The control part 41b outputs a marking command for step S30 to the marking part 20 and the device arrangement part 30. Specifically, the laser light source 21 outputs laser light. The laser marking is performed for all of the set marking places mp. In an output operation of the laser light to each of the marking places mp, the image processing part 41c may determine whether or not the mark image appears on the pattern image. When it is determined that the mark image does not appear on the pattern image, the irradiation of the laser light is performed again. In parallel with the irradiation operation of the laser light, the image processing part 41c generates a pattern image.

Hereinafter, an operation and effect of the semiconductor failure analysis device 1 of the present embodiment will be described.

In the semiconductor failure analysis device 1 and the semiconductor failure analysis method, first, the optical axis of the laser marking optical system 22 included in the marking part 20 is aligned with the optical axis of the observation optical system 13 included in the analysis part 10 based on the alignment target 50 provided on the wafer chuck 32. Then, the laser light is radiated to the marking position set in the semiconductor device D in a state in which the positional relationship between the optical axis of the observation optical system 13 and the optical axis of the laser marking optical system 22 is maintained. That is, after the optical axis of the observation optical system 13 and the optical axis of the laser marking optical system 22 are aligned with each other, one of the observation optical system 13 and the laser marking optical system 22 does not move relative to the other. Therefore, there is no deviation between a position indicated by a movement command value that may occur due to the movement and an actual position. As a result, it is possible to reduce a deviation of a position indicated by the mark put by the marking part 20 with respect to the position of the failure place indicated by the analysis part 10.

Before the alignment command is output, the control part 41b outputs an analysis command for analyzing the failure place of the semiconductor device D by the analysis part 10 to the analysis part 10. With such a configuration, it is possible to put a mark indicating the position of the failure place with high accuracy.

In the marking command, the semiconductor device D may be irradiated with the laser light after the wafer chuck 32 is moved to the marking position by the XY drive part 33. With such a configuration, after the optical axis of the laser marking optical system 22 is aligned with the optical axis of the observation optical system 13, it is possible to irradiate a desired position on the semiconductor device D with the laser light in a state in which an absolute position in addition to the relative position of the observation optical system 13 and the laser marking optical system 22 is maintained. As a result, it is possible to further reduce the deviation of the position indicated by the mark put by the marking part 20.

The alignment command causes the two-dimensional camera 15 to acquire a first image of the alignment target 50 from one side, causes the probing camera 24 to acquire a second image of the alignment target 50 from the other side, and moves the second drive part to align the optical axis of the laser marking optical system 22 with the optical axis of the observation optical system 13 based on the first image and the second image. With such a configuration, the operation in which the optical axis of the laser marking optical system 22 is aligned with the optical axis of the observation optical system 13 can be reliably performed.

The alignment target 50 is provided at a position different from the device holding part 32a in which the semiconductor device D is held on the wafer chuck 32. With such a configuration, the optical axis of the laser marking optical system 22 can be aligned with the optical axis of the observation optical system 13 regardless of a type of the semiconductor device D.

The two-dimensional camera 15 acquires the first image of the alignment target 50 seen from one side. The probing camera 24 acquires the second image of the target seen from the other side. Also with such a configuration, the operation in which the optical axis of the laser marking optical system 22 is aligned with the optical axis of the observation optical system 13 can be reliably performed.

The alignment target 50 includes the light transmission part 50a that transmits light that can be detected by the two-dimensional camera 15 and the probing camera 24. Also, with such a configuration, the operation in which the optical axis of the laser marking optical system 22 is aligned with the optical axis of the observation optical system 13 can be reliably performed.

Although the embodiment of the present invention has been described above, the present invention is not limited to the above embodiment.

For example, it has been described that the laser marking is performed to the extent that the laser light penetrates the metal layer ME and the surface of the substrate SiE in contact with the metal layer ME is exposed. However, the present invention is not limited to the aspect. A depth of the hole by the laser marking may be such that the mark image appears in the pattern image. Specifically, for example, the laser marking may be further performed even after the metal layer ME is penetrated and the surface of the substrate SiE in contact with the metal layer ME is exposed. For example, when a thickness of the metal layer ME is 10 μm and a thickness of the substrate SiE is 500 μm, a hole by the laser marking may be formed by about 1 μm deeper from the surface of the substrate SiE in contact with the metal layer ME.

Further, the laser marking does not necessarily have to be performed so as to penetrate the metal layer ME. For example, when the thickness of the metal layer ME is 10 pin and the thickness of the substrate SiE is 500 μm, the thickness of the metal layer ME at a portion in which the hole is formed by the laser marking may be about 50 nm. That is, the hole does not have to reach the surface of the substrate SiE in contact with the metal layer ME.

It has been described that the generation of the pattern image is performed while the laser marking is being performed. However, the present invention is not limited to this aspect. For example, the pattern image may be generated when the output of the laser light is stopped. In this case, the output of the laser light and the stop of the laser light, that is, the generation of the pattern image may be alternately performed at a predetermined interval.

When a wavelength of the laser light output from the laser light source 21 is 1000 nanometers or more, the observation optical system 13 may have an optical filter that blocks only the laser light having a wavelength of 1000 nanometers or more. Therefore, even when the laser light output from the laser light source 21 is transmitted through the substrate SiE of the semiconductor device D, the laser light is blocked by the observation optical system 13. As a result, it is possible to suppress destruction of the optical detector due to the laser light.

The wavelength of the laser light output from the laser light source 21 may be less than 1000 nanometers. In this case, for example, when the semiconductor device D is configured of a substrate such as a silicon substrate, the laser light is absorbed by the substrate. As a result, it is possible to suppress destruction of the optical detector such as the two-dimensional camera 15 due to the laser light without providing an optical filter or the like.

The component that applies the stimulus signal to the semiconductor device D is not limited to the tester unit 11. As a stimulus signal application part which is the component for applying a stimulus signal to the semiconductor device D, a device that applies a voltage or a current to the semiconductor device D may be adopted. Then, the stimulus signal may be applied to the semiconductor device D using such a device.

REFERENCE SIGNS LIST

1 Semiconductor failure analysis device, 10: Analysis part, 11: Tester unit, 12: Light source, 13: Observation optical system (first optical system), 14: XYZ stage (first drive part), 15: Two-dimensional camera (first optical detection part), 20: Marking part, 21: Laser light source, 22: Laser marking optical system (second optical system), 23: XYZ stage (second drive part), 24: Probing camera (second optical detection part), 25: Illumination light source, 30: Device arrangement part, 31: Sample stage, 32: Wafer chuck, 33: XY drive part (third drive part), 32a: Device holding part, 32b: Target hole, 40: Computer, 41a: Condition setting part, 41b: Control part, 41c: Image processing part, 41e: Input part, 41d: Display part, 50: Alignment target, 50a: Light transmission part, 50b: Opaque part, D: Semiconductor device, ME: Metal layer, fp: Failure place, mp: Marking place.

The invention claimed is:

1. A semiconductor failure analysis device comprising:
an analyzer in which a first optical detector receives first light from a semiconductor device via a first optical system, and the first optical system is moved relative to the semiconductor device by a first driver;
a marking part in which a second optical detector receives second light from the semiconductor device via a second optical system, the semiconductor device is irradiated with laser light via the second optical system, and the second optical system is moved relative to the semiconductor device by a second driver;
a device arrangement part having a chuck disposed between the analysis part and the marking part to hold the semiconductor device and provided with a target that aligns an optical axis of the first optical system with an optical axis of the second optical system, the chuck being moved relative to the analysis part and the marking part by a third driver; and
a controller configured to output a command to the analyzer, the marking part, and the device arrangement part, wherein the target is detectable by the first optical detector from one side of the target and is detectable by the second optical detector from the other side of the target, and the controller outputs an alignment command that moves the chuck to a position at which the target is detectable by the first optical detector and then aligns the optical axis of the second optical system with the optical axis of the first optical system with the target as a reference to the marking part and the device arrangement part, and outputs a marking command that irradiates a marking position set on the semiconductor device with the laser light in a state in which a positional relationship between the optical axis of the first optical system and the optical axis of the second optical system is maintained to the marking part and the device arrangement part.

2. The semiconductor failure analysis device according to claim 1, wherein the controller outputs an analysis command that analyzes a failure place in the semiconductor device with the analyzer to the analyzer before the alignment command is output.

3. The semiconductor failure analysis device according to claim 1, wherein the marking command causes the chuck to be moved to the marking position by the third driver and then causes the semiconductor device to be irradiated with the laser light.

4. The semiconductor failure analysis device according to claim 1, wherein the alignment command causes the first optical detector to acquire a first image of the target from one side, causes the second optical detector to acquire a second image of the target from the other side, and moves the second optical system so that the optical axis of the second optical system is aligned with the optical axis of the first optical system based on the first image and the second image.

5. The semiconductor failure analysis device according to claim 1, wherein the target is provided at a position different from a device holding part holder of the chuck in which the semiconductor device is held.

6. The semiconductor failure analysis device according to claim 1, wherein the first optical detector acquires a first image of the target seen from one side, and
the second optical detector acquires a second image of the target seen from the other side.

7. The semiconductor failure analysis device according to claim 1, wherein the target includes a light transmission part which transmits light that is detectable by the first optical detector and the second optical detector.

8. A semiconductor failure analysis method which analyzes a semiconductor device using a semiconductor failure analysis device, wherein the semiconductor failure analysis device includes:

an analyzer in which a first optical detector receives first light from the semiconductor device via a first optical system, and the first optical system is moved relative to the semiconductor device by a first driver;

a marking part in which a second optical detector receives second light from the semiconductor device via a second optical system, the semiconductor device is irradiated with laser light via the second optical system, and the second optical system is moved relative to the semiconductor device by a second driver;

a device arrangement part having a chuck disposed between the analyzer and the marking part to hold the semiconductor device and provided with a target that aligns an optical axis of the first optical system with an optical axis of the second optical system, the chuck being moved relative to the analyzer and the marking part by a third driver; and a controller configured to output a command to the analyzer, the marking part, and the device arrangement part, wherein the target is detectable by the first optical detector from one side of the target and is detectable by the second optical detector from the other side of the target,
the method comprising:

moving the chuck to a position at which the target is detectable by the first optical detector and then aligning the optical axis of the second optical system with the optical axis of the first optical system with the target as a reference; and irradiating a marking position set on the semiconductor device with the laser light in a state in which a positional relationship between the optical axis of the first optical system and the optical axis of the second optical system is maintained.

9. The semiconductor failure analysis method according to claim 8, further comprising analyzing a failure place in the semiconductor device with the analyzer before aligning the optical axis of the second optical system.

10. The semiconductor failure analysis method according to claim 8, wherein the marking step causes the chuck to be moved to the marking position by the third driver and then causes the semiconductor device to be irradiated with the laser light.

11. The semiconductor failure analysis method according to claim 8, wherein causes the first optical detector to acquire a first image of the target from one side, causes the second optical detector to acquire a second image of the target from the other side, and moves the second drive system so that the optical axis of the second optical system is aligned with the optical axis of the first optical system based on the first image and the second image.

* * * * *